United States Patent
Li et al.

(10) Patent No.: US 7,019,325 B2
(45) Date of Patent: Mar. 28, 2006

(54) BROADBAND LIGHT EMITTING DEVICE

(75) Inventors: Lianhe Li, Chavannes (CH); Andrea Fiore, Lausanne (CH); Lorenzo Occhi, Pfäffikon (CH); Christian Velez, Richterswil (CH)

(73) Assignee: Exalos AG, Zurich (CH)

( * ) Notice: Subject to any disclaimer, the term of this patent is extended or adjusted under 35 U.S.C. 154(b) by 14 days.

(21) Appl. No.: 10/869,616

(22) Filed: Jun. 16, 2004

(65) Prior Publication Data

US 2005/0279989 A1    Dec. 22, 2005

(51) Int. Cl.
H01L 29/06      (2006.01)
H01L 31/0328   (2006.01)
H01L 31/0336   (2006.01)
H01L 31/072    (2006.01)
H01L 31/109    (2006.01)

(52) U.S. Cl. ............................. 257/14; 257/15; 257/17; 257/18; 257/21; 257/22; 257/82; 257/85

(58) Field of Classification Search ............ 257/11–15, 257/17, 18, 21, 22, 82, 85
See application file for complete search history.

(56) References Cited

U.S. PATENT DOCUMENTS 5,252,839 A    10/1993  Fouquet
6,184,542 B1   2/2001   Alphonse 2005/0045868 A1 * 3/2005 Otsubo et al. ............... 257/14

OTHER PUBLICATIONS

High-Performance Quantum-Dot Superluminescent Diodes, Z.Y. Xhang et al., IEEE Photonics Technology Letters, vol. 16 No. 1, Jan. 2004, pp. 27-29.
Tuning InAs/GaAs quantum dot properties under Stranski-Krastanov growth mode for 1.3 um applications, J.X. Chen et al., Journal of Applied Physics, vol. 91 No. 10, May 15, 2002, pp. 6710-6716.
Quantum-dot superluminescent diode: A proposal for an ultra-wide output spectrum, Zhong Zue Sun et al., pp. 1235-1242.

* cited by examiner

Primary Examiner—Thien F. Tran
(74) Attorney, Agent, or Firm—Rankin, Hill, Porter & Clark LLP (57) ABSTRACT

The invention concerns a superluminescent light emitting diode (SLED) comprising a semiconductor heterostructure forming a PN junction and a waveguide. The semiconductor heterostructure includes a gain region with a contact means for biasing the PN junction so as to produce light emission including stimulated emission from an active zone of the gain region, and in the active zone a plurality of quantum dot layers, each quantum dot layer made up of a plurality of quantum dots and a plurality of adjoining layers, each adjoining layer adjacent to one of said quantum dot layers. The material composition or a deposition parameter of at least two adjoining layers is different. This ensures an enhanced emission spectral width.

19 Claims, 5 Drawing Sheets

BROADBAND LIGHT EMITTING DEVICE

FIELD OF THE INVENTION

This invention is in the field of broadband light emitting devices. It more particularly relates to superluminescent light emitting diodes (SLEDs), to Semiconductor Optical Amplifiers (SOAs), to External Cavity Semiconductor lasers and other broadband electroluminescent devices and to methods of producing superluminescent light emitting diodes.

BACKGROUND OF THE INVENTION

Superluminescent light emitting diodes (SLEDs) are diodes that, when biased in the forward direction, become optically active and generate amplified spontaneous emission over a wide range of wavelengths.

SLEDs (sometimes also called Superluminescent diodes, SLDs) are attractive for applications in which a higher intensity than the one emitted by conventional LEDs is required, but where an even distribution of the emitted wavelength over a broad spectral range is desired. In a SLED for delivering a large incoherent light output from a first end facet, it is thus important to suppress laser oscillation.

In contrast to laser diodes, therefore, there is not sufficient feedback to obtain lasing action ("lasing" here is used to describe the function principle of a laser, i.e. to generate, by a feedback, stimulated emission in a gain medium pumped to provide population inversion and placed in a cavity providing the feedback, resulting in coherent radiation). This is usually achieved by the joint action of a tilted waveguide in which the generated radiation is guided and anti-reflection coated end facets. A tilted waveguide in this context is a waveguide which is not perpendicular to a plane defined by end facets of the device.

In U.S. patent application Ser. No. 10/763,508, which is incorporated herein by reference, a new method of suppressing laser oscillation has been described. According to this method, electrodes in an absorber region are kept at zero voltage so that absorption is enhanced.

Among the properties which are usually desired for SLEDs are a large spectral width and a high temperature stability. For this reason, quantum dot superluminescent diodes are promising. In such diodes, the gain medium is formed by a high quantity of quantum dots, which have usually been produced by self-assembly, such as by epitaxial growth of a quantum dot layer in the Volmer-Weber growth mode or in the Stranski-Krastanov growth mode. A large spectral width is achieved by a naturally occurring inhomogeneous size distribution leading to different electronic structures between the different quantum dots. High temperature stability occurs because of the non-continuous density of states, where the energy difference between neighboring states exceeds usual values of kT (k being Boltzmann's constant and T being the absolute temperature).

Although the inhomogeneous size distribution of the quantum dots brings about a relatively large spectral width naturally, it would be advantageous to even further increase the spectral width. For this purpose, it has been proposed to deliberately increase the dot size inhomogeneity distribution (Z.-Z. Sun et al., Optical and Quantum Electronics 31, p. 1235–1246 (1999)). However, the exact control of the quantum dot size dispersions is neither trivial nor easily reproducible. A different approach proposed was to use multiple layers with InAs quantum dots with different amounts of deposited InAs material in the quantum dots (Z. Y. Zhang et al., IEEE Photonics Technology Letters 16, p. 27–29 (2004)). Since the amount of InAs also affects the density and radiative efficiency of the quantum dots (QDs), this last approach is difficult to implement, too.

Other electroluminescent elements in which a broadband emission spectrum is desired include Semiconductor Optical Amplifiers in which spontaneous emission is used for amplifying incoming radiation (of potentially a broad bandwidth) and external cavity semiconductor lasers, in which a large emission spectrum is desired in order to be able to tune the laser output in a large range.

SUMMARY OF THE INVENTION

For these reasons, it would be beneficial to have an electroluminescent light emitting device with a broad emission spectrum and a high temperature stability which overcomes drawbacks of prior art devices and which especially has a spectral width that goes beyond the spectral width of self-assembled quantum dot superluminescent light emitting diodes without having the reproducibility and practical problems of mentioned prior art approaches. Especially, the device should be producible in high quantities for commercial applications with reproducible properties.

Therefore, an electroluminescent light emitting device is provided comprising a semiconductor heterostructure forming a PN junction, the semiconductor heterostructure including a gain region with a contact means for biasing the PN junction so as to produce light emission including stimulated emission from an active zone of the gain region. The semiconductor heterostructure in the active zone comprises a plurality of quantum dot layers, each quantum dot layer comprising a plurality of quantum dots, and a plurality of adjoining layers, each adjoining layer adjacent to one of said quantum dot layers, wherein the material composition or a deposition parameter of at least two adjoining layers is different. Deposition parameters that may be varied may comprise the layer thickness.

According to an other aspect, the invention concerns an electroluminescent element with a semiconductor heterostructure, the semiconductor heterostructure including, on a substrate, a first cladding layer and a second cladding layer and a light emission arrangement arranged between the first and the second cladding layers, said light emission arrangement emitting electromagnetic radiation into an optical beam path upon injection of a current, the light emission arrangement including a layer stack comprising a plurality of quantum dot layers, each quantum dot layer sandwiched by a barrier layer and a capping layer, the capping layers of at least quantum dot layer being made of differing materials.

According to yet another aspect, the invention concerns an superluminescent light emitting diode comprising a semiconductor heterostructure, the semiconductor heterostructure including, on a substrate, a first cladding layer and a second cladding layer and a light emission arrangement arranged between the first and the second cladding layers, said light emission arrangement emitting, upon injection of a current, electromagnetic radiation into a waveguide formed by said heterostrucutre, the light emission arrangement including a layer stack comprising a plurality of quantum dot layers, each quantum dot layer sandwiched by a barrier layer and a capping layer, at least two of said capping layers being made of differing materials or having a different thickness.

The invention also concerns a method of producing an electroluminescent light emitting diode with a semiconductor heterostructure junction and a waveguide. The method comprises the steps of providing a substrate, of fabricating layers of a semiconductor heterostructure and waveguide structure on said substrate and of providing electrode contacts for biasing said semiconductor heterostructure junction made up by said semiconductor heterostructure, the step of fabricating a semiconductor heterostructure including the partial steps of fabricating a barrier layer, of growing a layer of self-assembling semiconductor material thereon, whereby a layer of quantum dots is created, of growing an adjoining layer of semiconductor material different from the self-assembling semiconductor material on said layer of quantum dots and of repeating said steps of growing a barrier layer, a layer of quantum dots and a adjoining layer, wherein the material composition or a deposition parameter of at least two adjoining layers is chosen to be different.

Several reasons may be expected to contribute to the effect that the emission wavelength depends on the composition of the adjoining layer or adjoining layers. Firstly, the barrier height confining the quantum dot electronic states changes. Secondly, the strain induced on the quantum dot material by the adjoining layer depends on the adjoining layer's lattice constant which is dependent on the material composition. A third possible effect may arise depending on the material compositions of the quantum dots and of the adjoining layer: If the chemical elements making up the quantum dots are also present in the adjoining layer material, the quantum dots may grow further than they would from just the quantum dot layer deposited material. Material from the adjoining layer may thus "adhere" to the quantum dot. This may be because of activated spinoidal decomposition of the adjoining layer, which may in deposits preferentially be on the strained region on top of the QD and thus increase the quantum dot heights. Also, it is possible that the chemical composition of the quantum dot itself changes dependent on the adjoining layer's composition, due to diffusion effects. What is important is that the wavelength may be influenced based on parameters of the adjoining layer, which principle allows to stick to the optimal growth conditions when fabricating the quantum dot layer and to tune the emission spectrum in a separate step, namely in the adjoining layer fabrication step.

The invention uses this insight that the optical transition or the optical transitions can be engineered by varying the surrounding material, i.e. the material of the adjoining layer. Thereby, controlling the quantum dot emission wavelength—and ultimately the SLED emission spectrum—by varying the adjoining layer material is possible. By stacking quantum dot layers with different adjoining layer materials or adjoining layer thicknesses, a wide emission spectrum can be achieved.

BRIEF DESCRIPTION OF THE DRAWINGS

These and further features of the present invention will be apparent with reference to the following description and drawings, wherein.

DESCRIPTION OF THE PREFERRED EMBODIMENTS

Figure 1:
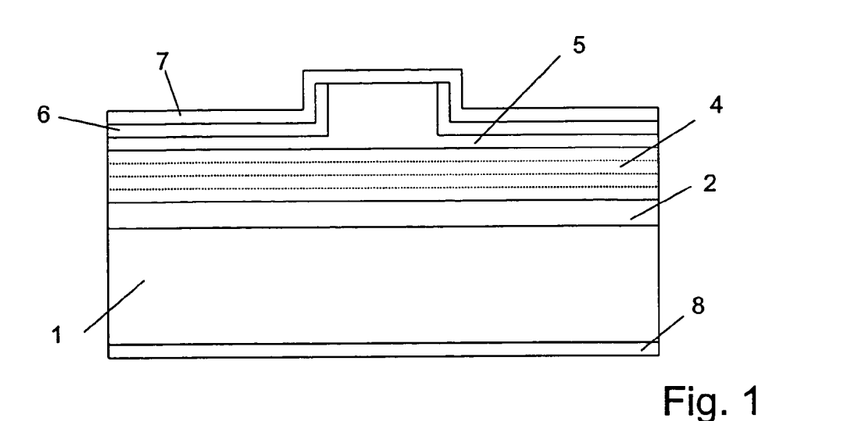
FIG. 1 depicts a schematic cross section of a device according to the invention.

The device schematically shown in FIG. 1 is suitable for emission around a technologically important wavelength of 1.3 μm. It comprises a semiconductor heterostructure including a GaAs substrate 1. The substrate comprises an Si-doped (the Si doping here being an n-doping) InGaP or AlGaAs semiconductor cladding layer 2. On top of the Si-doped cladding layer, a layered structure 4 forming a PN-junction and comprising the active zone is placed. The layered structure 4 comprises a plurality of layers of quantum dots, as will be explained in more detail below. On the layered structure 4, there is a second cladding layer 5 with a ridge structure. The embodiment of the figure further comprises a thin insulating layer 6, for example an oxide layer, and a top electrode layer 7. A second electrode 8 (or bottom electrode) is provided on the backside of the substrate 1. Upon injection of a current—the current flows between the top and the bottom electrode—electroluminescence generates radiation in the active zone. The radiation is guided along the ridge, vertically confined by the structure of layers having different indexes of refraction, and laterally confined by the ridge (weakly index guided). Of course, the fact that the actual active zone is also laterally confined contributes to the confinement of the radiation, too.

The heterostructure may comprise further layers not shown in the drawing, such as buffer layers etc, or the cladding may comprise several layers etc. The design of heterostructures for SLEDs or (similarly) edge-emitting semiconductor lasers or SOAs once a material for the active zone is given as such are known in the art. Semiconductor heterostructures comprising a plurality of quantum dot layers with different adjoining layers according to the invention in the active zone are well suited for any SLED or SOA or laser design known in the art.

Also, lateral confinement may be achieved by any known method, such as weakly index guided structures, an example of which may be seen in FIG. 1, but also strongly index guided or gain guided structures may be used.

Figure 2:
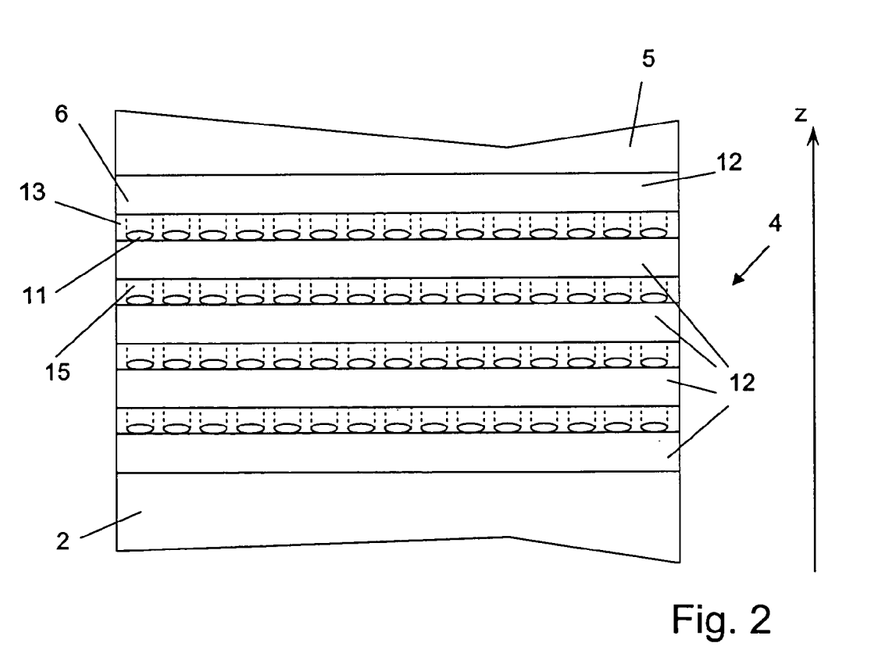
FIG. 2 shows a close-up of a cross section of the layered structure of the device of FIG. 1.

FIG. 2 shows the layered structure for building the gain region in more detail. The layered structure is arranged between two cladding layers 2, 5. It comprises a plurality of GaAs barrier layers 12. On each but the topmost barrier layer 12, a layer of quantum dots 11 is arranged. Each layer of quantum dots is covered by a capping layer 13 being an adjoining layer in the context of this invention. The capping layers are $In_xGa_{1-x}As$ layers with x varying from layer to layer between 0.1 and 0.15. It has been observed that in this system, the material immediately on top of each quantum dot is In enriched compared to the surrounding capping layer material. This leads to In rich columns 15 on top of the quantum dots. This phenomenon is observed in the mentioned heterostructure based on InAs and InGaAs and is expected to contribute to the influence of the adjoining layer composition on the emission wavelength. However, the invention holds also for systems not showing this phenomenon, as long as the adjoining layer material has an influence on the emitted wavelength.

The thickness of the GaAs barrier layers for example is between 10 nm and 50 nm, the thickness of the quantum dot layers may be between 0.5 and 1 nm, and the thickness of the capping layers may for example be between 1 nm and 10 nm. As is usual in the art, the thickness of irregularly grown layers such as island layers is measured in values that correspond to the thickness of a hypothetical layer comprising the same amount of material but evenly distributed.

As pointed out above, the In composition in the $In_xGa_{1-x}As$ capping layer, i.e. the x value, changes the emission wavelength. According to the current understanding, this is mainly due to a change in the strain configuration and quantum dot height. According to the current understanding of the nature of the physical and chemical processes, the quantum dot height of the InAs quantum dots increases upon deposition of the capping layers due to activated spinoidal decomposition of the InGaAs capping layer.

Figure 3:
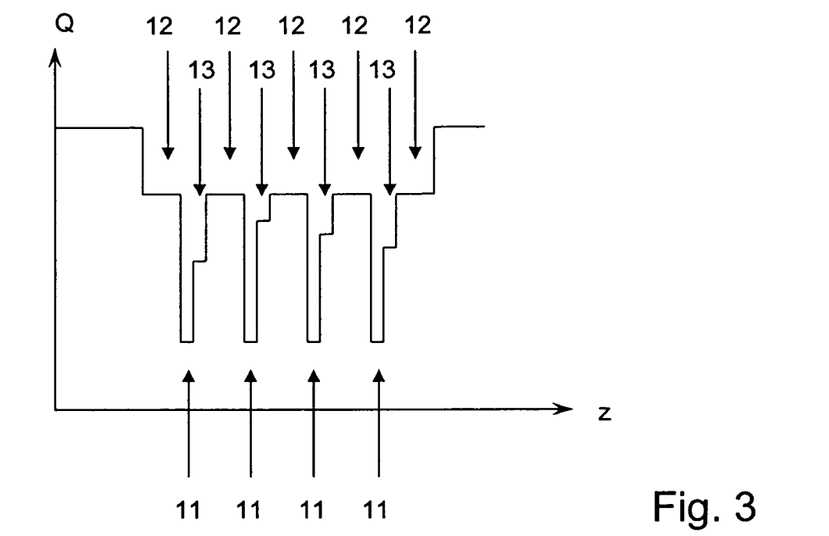
FIG. 3 shows a schematic illustration of a concept of embodiments of the invention.

An illustration of a concept of embodiments of the invention is shown in FIG. 3. There, a physical quantity Q is depicted as a function of the z coordinate (c.f. FIG. 2). As can be seen, the quantity Q varies between the capping layers 13. The quantity Q has an influence on the emission wavelength. Preferably, the variation of the quantity is chosen such that the difference in emission wavelength between quantum dot layers leading to emission contributions neighboring each other in the spectrum is smaller than the spectral width of a single contribution, so that by superposition of the contributions of all quantum dot layers a continuous, broad spectrum is created. As a remark, the quantum dot layers creating contributions that neighbor each other in the emission spectrum need not be physically neighboring, as can also be seen in FIG. 3, where the quantity Q of the first and the forth capping layer border each other.

Examples of the physical quantity Q may be the energy of the lowest conduction band state, as in the FIG. 3, or the lattice constant (or lattice mismatch to the quantum dot material, respectively), a tendency to induce chemical changes etc. Often, more than one of the physical quantities alter when the material parameter—x in the given example—is varied.

Figure 6A:
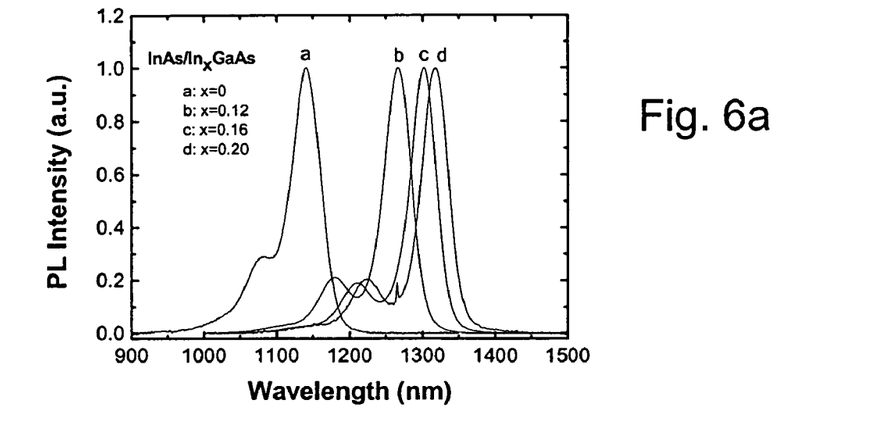
FIG. 6a is a graph showing the room-temperature (RT) photoluminescence (PL) spectra of single QD layers with 5 nm-thick InGaAs capping layers having different In composition.
Figure 6B:
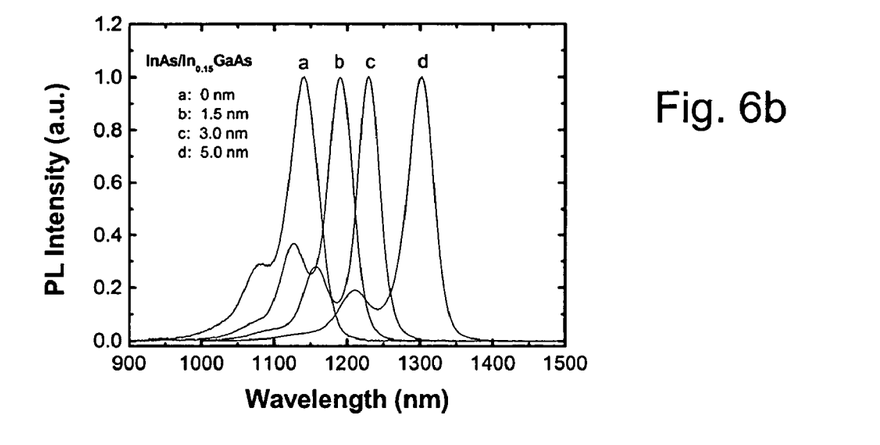
FIG. 6b is a graph showing the RT PL spectra of single QD layers where the InGaAs composition is fixed but the thickness is varied from 0 to 5 nm.
Figure 6C:
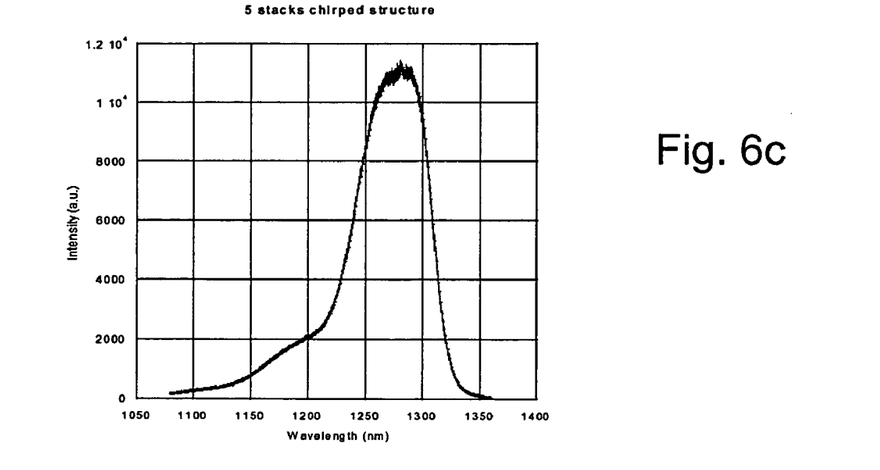
FIG. 6c is a graph depicting an emission spectrum obtained from a multiple stack of QD layers bordered by InGaAs capping layers with In composition varying from 10 to 15%.

FIG. 6a shows the room-temperature (RT) photoluminescence (PL) spectra of single QD layers with 5 nm-thick InGaAs capping layers having different In composition. The shift of the spectrum with increasing In composition is evident. FIG. 6c reports the RT PL spectrum of a stack of 5 QD layers with In composition in the 5 nm-thick InGaAs capping layer varying from 10 to 15%: The linewidth is significantly broadened to 60 nm due to the sum of the emission from the different QD layers.

As an alternative to the described material system based on InAs, InGaAs, and GaAs, other material compositions may be chosen, for example InAs quantum dots and of the $In_xAl_yGa_{1-x-y}As_zP_{1-z}$ (0<x,y,z<1) capping layers on InP substrates for emission in the 1.4–1.6 μm wavelength range, $In_xGa_{1-x}As$ quantum dots and $Al_yGa_{1-y}As$ capping layers on GaAs substrates for emission in the 0.6–0.8 μm wavelength range, $In_xGa_{1-x}N$ quantum dots and $In_yAl_zGa_{1-y-z}N$ capping layers on GaN or $Al_2O_3$ or SiC substrates for emission in the 0.4–0.6 μm wavelength range, $Si_xGe_{1-x}$ quantum dots with $Si_yGe_{1-y}$ (x≠y) capping layers on Si substrates for emission in the 1000–1500 nm wavelength range.

In the shown embodiments, p-doped layers and n-doped layers can be interchanged.

Figure 4:
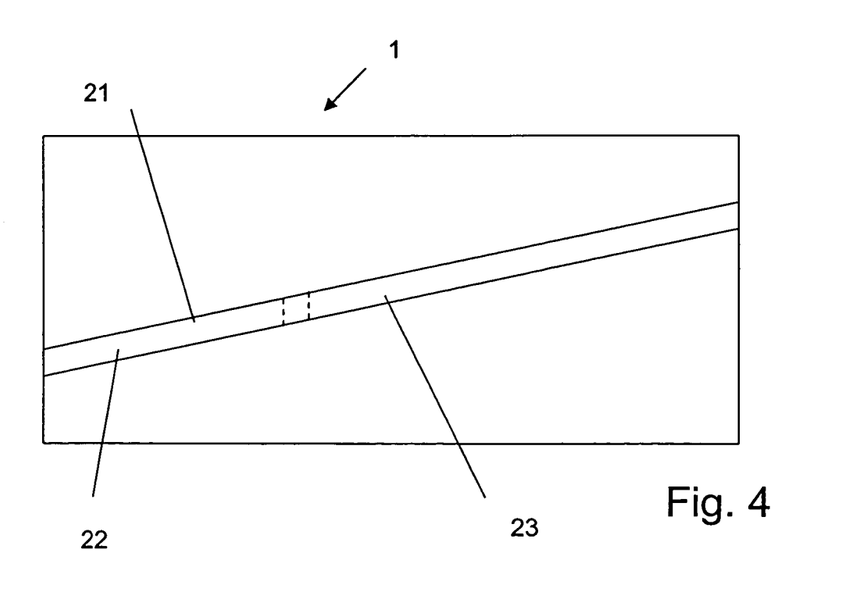
FIG. 4 shows a very schematic top view of an embodiment of an SLED according to invention.

FIG. 4 shows a very schematic top view of an embodiment of a device according to the invention, the device being a SLED. By measures for assuring lateral confinement explained above, a waveguide stripe 21 is formed. In the shown embodiment, the waveguide is straight and is at an angle to the front and the back facets so as to prevent reflected light from creating a feedback. This is desired in SLEDs. As an alternative to the shown geometry, the waveguide may be at least partially bended, may be perpendicular to the front and/or end facets etc. In the shown embodiment, the waveguide comprises a gain region 22 and an absorber region 23. In the absorber region, the PN junction may or may not be reverse biased or unbiased as described in the U.S. patent application Ser. No. 10/763,508. The absorber region is optional. Instead of the divided set-up of FIG. 4, the gain region may be spread over the entire length of the waveguide stripe.

In addition, antireflection coatings (not shown) may optionally be provided at one of the facets or at both facets.

FIGS. 5a through 5e depict steps in a method of fabricating a device according to the invention.

Figure 5A:
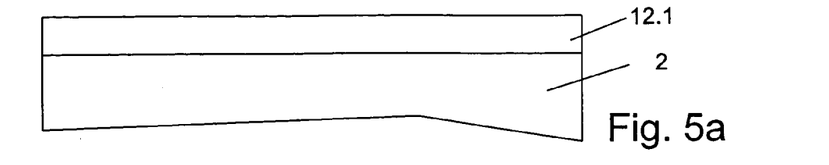
FIGS. 5a through 5f schematically depict method steps of a method of fabricating a device according to the invention.

FIG. 5a shows a cladding layer 2 of buffer layer provided on a substrate (not shown in this figure). The cladding layer is provided with a first barrier layer 12.1 by a conventional deposition method such as molecular beam epitaxy (MBE) or metalorganic vapor-phase epitaxy (MOVPE) or chemical-vapor deposition (CVD). The barrier layer in the embodiment described here is a GaAs layer.

Figure 5B:
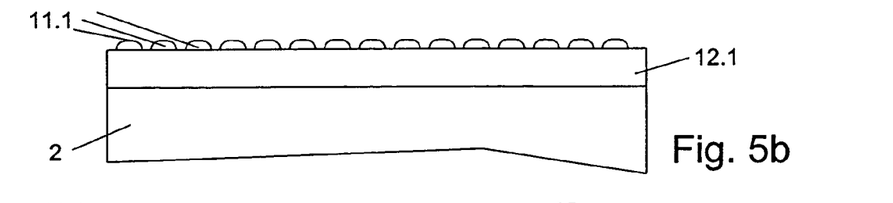

In a next step, depicted in FIG. 5b a quantum dot layer is added. To this end, quantum dot layer material is deposited by molecular beam epitaxy or metalorganic vapor-phase epitaxy on the barrier layer. The quantum dot layer material is chosen to be self-assembling on the barrier layer, so that island growth occurs. InAs grows in the Stranski-Krastanov growth mode on GaAs, i.e. after a first covering monolayer of material, islands assemble. The islands 11.1 are later to serve as quantum dots. The deposition parameters such as substrate temperature, growth rate, sequence of deposited sub-layers or amount of deposited material (layer thickness) may be chosen to optimize manufacturing efficiency, electronic parameters, radiative efficiency and reproducibility without having to consider any measures for assuring a broad emission spectrum.

Figure 5C:
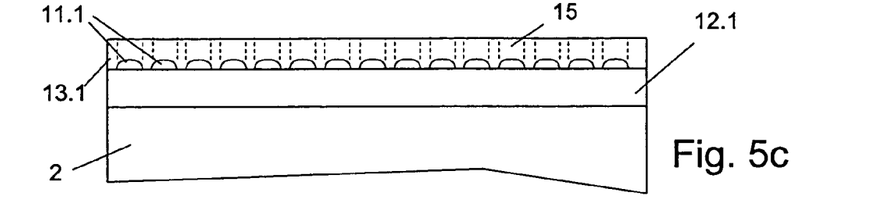
Figure 5D:
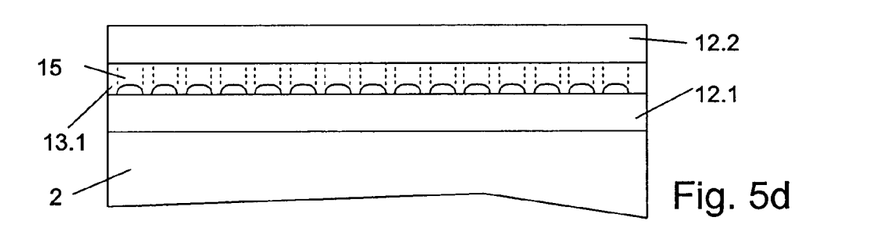
Figure 5E:
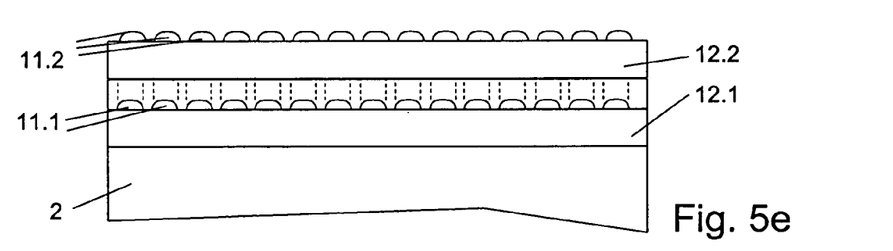

Next, a capping layer 13.1 being an adjoining layer is added by MBE or MOVPE, as shown in FIG. 5c. In this process, In-rich columns 15 are built automatically.

Figure 5F:
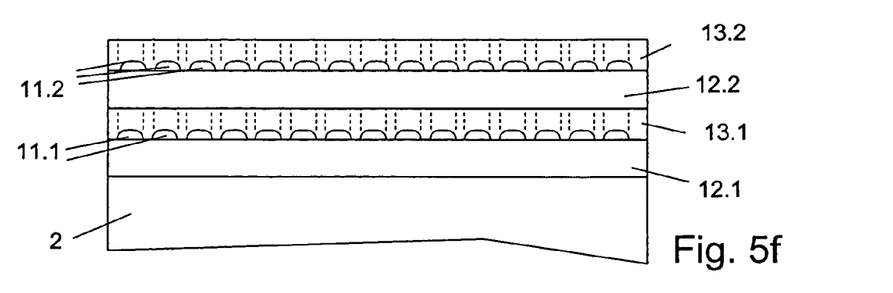

Then, a second barrier 12.2 layer is added (FIG. 5d), whereupon again a quantum dot layer 11.2 is deposited (FIG. 5e), preferably with the same growth parameters as used for the first quantum dot layer 11.1. Then again the capping layer is deposited (FIG. 5f), the material of the second capping layer 13.2 being different from the material of the first capping layer 13.1. The barrier layer, quantum dot layer and capping layer deposition steps are repeated as often as desired. Preferably, between 5 and 15 quantum dot layers are deposited, even though in FIG. 2 only four layers are shown for clarity reasons. The capping layer material of all capping layers may be different, or groups of capping layers may comprise the same material.

Instead of varying the material of the capping layers, other parameters of an adjoining layer may be varied. For example, material of an adjoining layer upon which the quantum dot layer is deposited may by varied. As an alternative, the quantum dot layers may be provided with an embedding layer made up of a layer underneath them and a layer capping them. As an alternative, capping layers as shown in the figures described above may be used, but instead of varying the material composition, an other growth parameter is systematically varied, for example the deposition rate or the temperature. Also, the capping layers may be realized as digital alloys (sequences of very thin, alternated layers of InAs and GaAs), and the relative thickness of the layers may be varied to change the average In composition. A further possible variation of a deposition parameter is varying the thickness of otherwise identical capping layer. FIG. 6b shows the RT PL spectra of single QD layers where the InGaAs composition is fixed but the thickness is varied from 0 to 5 nm. By making multiple stacks with varying thickness a broad emission spectrum similar to the one shown in FIG. 6c may be obtained.

The above description explains how the emitted spectrum may be broadened by means of varying the material or another parameter of the capping layers. The spectrum may be even further broadened if emission from different quantum states in the quantum dots is excited, by injecting a current which is high enough to saturate the lowest quantum state and thus populate the higher-energy states.

Figure 7:
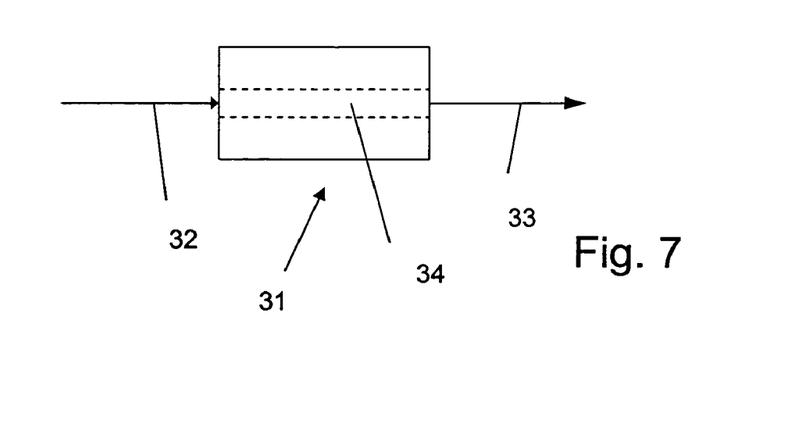
FIG. 7 very schematically shows a top view of a Semiconductor Optical Amplifier according to the invention.

In FIG. 7, an example of a broadband semiconductor optical amplifier 31 is shown. The amplifier comprises a heterostructure of the kind described above, for example a structure as described with reference to FIGS. 1 and 2. Incoming light 32 is amplified by stimulated emission in the active zone of the heterostructure when the PN junction is biased. The amplified light beam 33 is emitted after one pass through the device. The waveguide structure 34 is also indicated in the FIG. 7.

Figure 8:
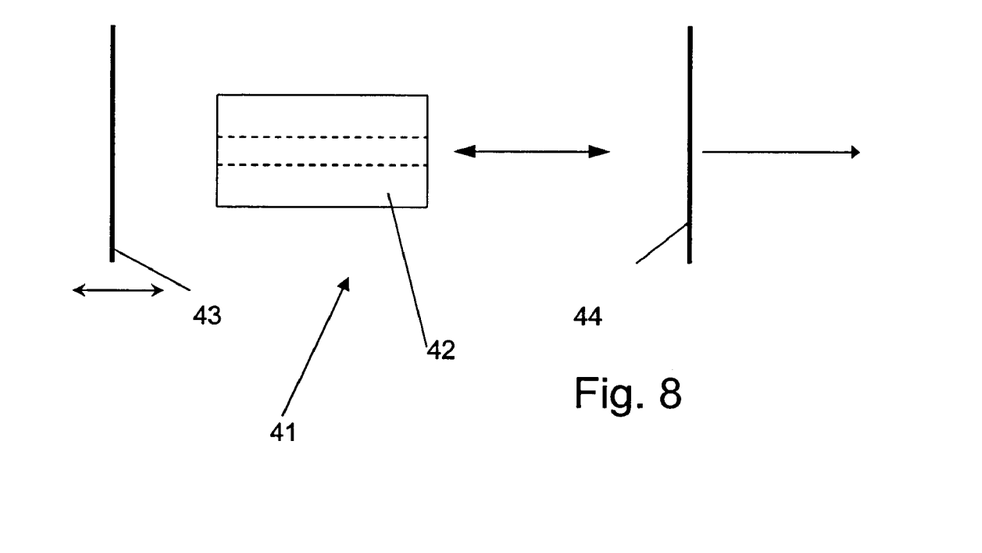
FIG. 8 also very schematically shows a top view of an external cavity semiconductor laser with a tunable output wavelength according to the invention.

FIG. 8 shows very schematically an external cavity edge emitting semiconductor laser 41, wherein the gain material 42 is designed according to the above defined and described principles. The gain material 42 may comprise a heterostructure as described with reference to FIGS. 1 and 2. The laser 41 further to the gain material comprises a plurality of mirror elements 43, 44 defining a laser cavity in which the gain material is arranged. In the figure, the most simple cavity design comprising only two cavity mirrors, one of them being the partially transparent outcoupling mirror 44 is illustrated. One of the cavity mirrors—and potentially other parameters of the laser cavity—may be displaced with respect to the other cavity elements, so that the wavelength of radiation for which the resonator is stable and ultimately the laser wavelength is tunable. In addition or as an alternative to displacing the mirror, other tunable wavelength selective elements—which are as such and as a means for tuning laser wavelengths well-known in the art—may be present. Also, the laser may comprise further elements, such as focussing means etc. Further, the invention is also applicable to surface emitting external cavity semiconductor layers.

Various other embodiments may be envisaged without departing from the scope and spirit of this invention.

What is claimed is:

1. An electroluminescent light emitting device comprising a semiconductor heterostructure forming a PN junction,
   the semiconductor heterostructure including a gain region with a contact means for biasing the PN junction so as to produce light emission including stimulated emission from an active zone of the gain region,
   the semiconductor heterostructure in the active zone comprising a plurality of quantum dot layers, each quantum dot layer comprising a plurality of quantum dots
   and a plurality of adjoining layers, each adjoining layer adjacent to one of said quantum dot layers,
   wherein the material composition or a deposition parameter of at least two adjoining layers is different.

2. The device according to claim 1, wherein at least two adjoining layers have a different layer thickness and are made from the same material.

3. The device according to claim 1, comprising current injection means for injecting a current high enough to saturate the lowest quantum state and thereby causing emission from different quantum states in the dots.

4. A device according to claim 1, wherein the heterostructure forms a strongly index guided waveguide into which light produced in the active zone is emitted.

5. A device according to claim 1, wherein the heterostructure forms a weakly index guided waveguide into which light produced in the active zone is emitted.

6. The device according to claim 1, wherein the active zone comprises a layered structure with a plurality of barrier layers, pairs of said barrier layers sandwiching one quantum dot layer and one adjoining layer.

7. The device according to claim 1 being a non-lasing Superluminescent Light Emitting Diode.

8. The device according to claim 1 being an external cavity semiconductor laser, further comprising a plurality of reflecting elements defining a laser cavity, the semiconductor heterostructure being placed within said laser cavity and serving as gain element of said laser.

9. The device according to claim 1, wherein the adjoining layer materials of said plurality of adjoining layers belongs to a material system, material compositions of which may be described by a group of parameters comprising at least one parameter, and wherein at least one parameter of said group of parameters differs between the adjoining layers.

10. The device according to claim 9, wherein said material system is the ternary system of the elements In, Ga, and As, and wherein said adjoining layer material is $In_xGa_{1-x}As$, x being said at least one parameter, and wherein said layer of quantum dots is an InAs layer.

11. The device according to claim 9, wherein said layer of quantum dots is an InAs layer, or a $In_xGa_{1-x}As$ layer or a $In_xGa_{1-x}As$ layer, or a $In_xGa_{1-x}N$ layer or a $Si_xGe_{1-x}$ layer.

12. The device according to claim 1, wherein the heterostructure forms a gain guided waveguide into which light produced in the active zone is emitted.

13. The device according to claim 12, wherein the semiconductor heterostructure comprises a first cladding layer and a second cladding layer, and said layered structure between the first and the second cladding layer, the first cladding layer being in electrical contact to a first metal electrode, the second cladding layer being in electrical contact to a second metal electrode.

14. The device according to claim 13, wherein the quantum dot layers are InAs layers, and wherein the capping layers are $In_xGa_{1-x}As$ layers, where x is a parameter with $0<x<1$, and where the x values of at least two capping layers differ.

15. The device according to claim 1 being a semiconductor optical amplifier.

16. The superluminescent light emitting diode according to claim 15, wherein the waveguide comprises two end facets limiting the waveguide in a longitudinal direction, the end facets being perpendicular to the longitudinal direction.

17. The superluminescent light emitting diode according to claim 15, comprising an absorber region wherein in the absorber region said PN junction is wired so as to be unbiased.

18. An electroluminescent light emitting device comprising a semiconductor heterostructure, the semiconductor heterostructure including, on a substrate, a first cladding layer and a second cladding layer and a light emission arrangement arranged between the first and the second cladding layers, said light emission arrangement emitting electromagnetic radiation into an optical beam path upon injection of a current, the light emission arrangement including a layer stack comprising a plurality of quantum dot layers, each quantum dot layer sandwiched by a barrier layer and a capping layer, at least two of said capping layers being made of differing materials.

19. A non-lasing superluminescent light emitting diode comprising a semiconductor heterostructure, the semiconductor heterostructure including, on a substrate, a first cladding layer and a second cladding layer and a light emission arrangement arranged between the first and the second cladding layers, said light emission arrangement emitting, upon injection of a current, electromagnetic radiation into a waveguide formed by said heterostrucutre, the light emission arrangement including a layer stack comprising a plurality of quantum dot layers, each quantum dot layer sandwiched by a barrier layer and a capping layer, at least two of said capping layers being made of differing materials or having a different thickness.

* * * * *

UNITED STATES PATENT AND TRADEMARK OFFICE
CERTIFICATE OF CORRECTION

PATENT NO. : 7,019,325 B2 Page 1 of 1
APPLICATION NO. : 10/869616
DATED : March 28, 2006
INVENTOR(S) : Li et al.

It is certified that error appears in the above-identified patent and that said Letters Patent is hereby corrected as shown below:

Column 8, Line 45, (Claim 11, Line 3), delete "$In_xGa_{1-x}As$" and insert --$In_xAl_{1-x}As$--.

Signed and Sealed this

Fifth Day of September, 2006

JON W. DUDAS
*Director of the United States Patent and Trademark Office*